(12) United States Patent
Van Winkelhoff et al.

(10) Patent No.: US 8,742,827 B2
(45) Date of Patent: Jun. 3, 2014

(54) POWER GATING CIRCUIT

(75) Inventors: Nicolaas Klarinus Johannes Van Winkelhoff, Villard Bonnot (FR); Mikael Brun, Grenoble (FR)

(73) Assignee: ARM Limited, Cambridge (GB)

( * ) Notice: Subject to any disclaimer, the term of this patent is extended or adjusted under 35 U.S.C. 154(b) by 132 days.

(21) Appl. No.: 13/067,319

(22) Filed: May 24, 2011

(65) Prior Publication Data
US 2012/0299636 A1 Nov. 29, 2012

(51) Int. Cl.
*H03K 17/687* (2006.01)

(52) U.S. Cl.
USPC .......................................... 327/434; 327/427

(58) Field of Classification Search
USPC ................................................. 327/427–434
See application file for complete search history.

(56) References Cited

U.S. PATENT DOCUMENTS

| 5,949,273 A * | 9/1999 | Mourick et al. ............... 327/442 |
| 7,126,370 B2 | 10/2006 | Bhattacharya |
| 7,696,649 B2 * | 4/2010 | Frey et al. ..................... 307/141 |

* cited by examiner

*Primary Examiner* — Lincoln Donovan
*Assistant Examiner* — Diana J Cheng
(74) *Attorney, Agent, or Firm* — Nixon & Vanderhye P.C.

(57) ABSTRACT

A functional circuit is coupled to a power supply conductor by at least one power gating transistor. A switching device applies a gate drive voltage to a gate terminal of the power gating transistor via a resistive element. The power gating transistor provides a Miller capacitance between its drain and gate terminals. The Miller capacitance, the resistance of the resistive element, and the drive strength of the switching device are configured such that, in response to the switching device switching the gate drive voltage to allow more current to pass through the power gating transistor, the Miller capacitance provides a feedback mechanism competing against the switching device to reduce the slew rate of the gate drive voltage such that the current passing between the power gate supply conductor and the functional circuit through the power gating transistor is less than the saturation current of the power gating transistor.

8 Claims, 6 Drawing Sheets

POWER GATING CIRCUIT

FIELD OF THE INVENTION

The present invention relates to integrated circuits. More particularly, the present invention relates to power gating.

BACKGROUND

It is known to use power gating transistors to control the power supply to an associated functional circuit. A control device provides a control signal to the gate terminal of the power gating transistors to control whether the transistors are on or off. When the power gating transistors are on, current passes between a power supply conductor and the functional circuit to power up the functional circuit. When the power gating transistors are off, the functional circuit is decoupled from the power supply conductor, and the functional circuit is powered down. By using the power gating transistors to cut off the power supply to a functional circuit which is not being used, power consumption can be reduced.

When the power gating transistors are first turned on, an in-rush current passes between the functional circuit and the power supply conductor. The in-rush current is the current needed to bring the functional circuit back to its powered state from a sleep or drowsy mode in which the power is off. If not controlled, then the in-rush current can be disadvantageously large. This can cause several problems. If the in-rush current is larger than can be handled by the physical limits of the design of the functional circuit, then the in-rush current arising when the functional circuit is first powered up can potentially destroy the functional circuit. Also, while the functional circuit is in a sleep mode, it is considered to be fully discharged. During the power up, the in-rush current may cause current to be drawn from other functional circuits neighbouring the functional circuit being powered up, which may reduce the voltage levels of those other circuits. To ensure that the other functional circuits operate correctly, the in-rush current should be limited.

To limit the magnitude of the in-rush current, it is conventional to provide an inverter chain on the line which supplies a control signal to the gate terminals of the power gating transistors. The chain of inverters delays the propagation of the control signal from one power gating transistor to the next, and so staggers the timing with which successive power gating transistors are turned on. Hence, fewer power gating transistors are switched on at once. By the time a later transistor switches on, an earlier transistor may have finished switching, thus smoothing the in-rush current over a longer period to reduce the magnitude of the peak in-rush current.

However, the chain of inverters requires additional gates to be added to the circuit. The inverters are always on and are connected between the high and low voltage supply rails, and so pass a large amount of leakage current. The leakage current increases the power consumption of the integrated circuit. Hence, the provision of an inverter chain reduces the extent to which power gating can reduce the power consumption of the integrated circuit. The present technique seeks to provide a way of limiting the magnitude of the in-rush current in a way that reduces the amount of leakage current.

SUMMARY

Viewed from one aspect, the present invention provides an integrated circuit comprising:
a functional circuit;
a power supply conductor for said functional circuit;
at least one power gating transistor having a source terminal coupled to said power supply conductor, a drain terminal coupled to said functional circuit, and a gate terminal, said at least one power gating transistor having a saturation current;
a switching device coupled to said gate terminal via a resistive element, said switching device being configured to apply a gate drive voltage to said gate terminal via said resistive element, an amount of current passed by said at least one power gating transistor being dependent on said gate drive voltage; wherein:
said at least one power gating transistor is configured to provide a Miller capacitance between said drain terminal and said gate terminal; and
said Miller capacitance, a resistance of said resistive element, and a drive strength of said switching device are configured such that, in response to said switching device switching said gate drive voltage to allow more current to pass through said at least one power gating transistor, said Miller capacitance provides a feedback mechanism competing against said switching device to reduce a slew rate of said gate drive voltage such that said current passing between said power supply conductor and said functional circuit through said at least one power gating transistor is less than said saturation current of said at least one power gating transistor.

The present technique recognises that the use of an inverter chain for regulating the magnitude of the in-rush current is not essential, and that, if the power gating transistors and associated switching circuitry are configured appropriately, then the power gating transistors themselves can provide a mechanism for reducing the magnitude of the in-rush current. The power gating transistors have a Miller capacitance between their drain and gate terminals. Normally, the effect of the Miller capacitance is negligible because it is swamped by the high drive strength of the control circuitry used to control the power gating transistors. Indeed, it is typical for circuit designers to design transistors so as to eliminate the effect of the Miller capacitance, which would otherwise slow the operation of the circuit.

Counter-intuitively, the present technique recognises that the Miller capacitance, which is usually regarded as a hindrance, can be useful for regulating the in-rush current. By amplifying the effect of the Miller capacitance, a feedback mechanism can be provided which competes against the switching of the power gating transistor so as to reduce the slew rate of the gate drive voltage. This causes the power gating transistor to turn on more slowly, thus limiting the current passing through the power gating transistor to less than the saturation current of the transistor. Hence, by enhancing the feedback mechanism provided by Miller capacitance, the in-rush current can be limited without the need for an inverter chain, hence reducing the amount of leakage current.

There are several parameters which control the extent to which the feedback effect of the Miller capacitance reduces the amount of in-rush current.

The power gating transistor can be designed to increase the Miller capacitance so as to increase the negative feedback effect. When the power gating transistor is switched on, the Miller capacitance is charged or discharged by the current passing between the switching device and the gate terminal of the power gating transistor. Since some current is needed to charge or discharge the Miller capacitance, less current is available to switch the gate drive voltage level, and so the slew rate of the gate drive voltage is reduced. This causes the power gating transistor to turn on more slowly, thus reducing the amount of in-rush current flowing through the power gating transistor. The greater the Miller capacitance, the greater the current required to charge or discharge the Miller capacitance, and hence the greater the extent to which the Miller capacitance reduces the in-rush current.

Also, the effect of the feedback mechanism can be increased by reducing the drive strength of the switching device which controls the gate drive voltage of the power gating transistor. When the drive strength of the switching device is reduced, this limits the maximum drive current passing between the switching device and the power gating transistor. The smaller the drive current, the greater the proportion of the drive current that is used to charge or discharge the Miller capacitance, and hence the greater the extent to which the Miller capacitance slows the slew rate of the gate drive voltage and reduces the in-rush current.

Similarly, the resistance of a resistive element coupling the switching device to the gate terminal of the power gating transistor can be increased. By increasing the resistance, the current passing between the switching device and the power gating transistor is reduced, which again reduces the slew rate of the gate drive voltage and hence causes the in-rush current to be reduced for the same reason as given in the previous paragraph.

Hence, the present technique recognises that, by configuring the drive strength of the switching device, the resistance of the resistive element, and the Miller capacitance of the power gating transistor to have appropriate values, the feedback effect of the Miller capacitance can be amplified so that it is no longer swamped by the drive strength of the switching device, so as to reduce the amount of leakage current. This runs contrary to the normal approach of designing power gating systems to eliminate the effect of Miller capacitance.

In one embodiment, the switching device comprises a first transistor for pulling the gate drive voltage to a power off level and a second transistor for pulling the gate drive voltage to a power on level. It can be useful to provide the second transistor with a lower drive strength than the first transistor. This means that when the functional circuit is turned on, then the low drive strength second transistor turns the functional circuit on slowly, thus reducing the magnitude of the in-rush current. On the other hand, when turning the functional circuit off, then the higher drive strength first transistor switches the circuit off quickly so as to cut off the supply of power to the functional circuit. The drive strength of the second transistor may also be lower than the drive strength of the at least one power gating transistor.

Optionally, the integrated circuit may comprise an additional switching transistor having a greater drive strength than the switching device. The additional switching transistor may be used to apply the gate drive voltage to the gate terminal after the functional circuit is in a substantially powered state. Hence, during power up the gate drive strength applied by the switching device is relatively weak to enhance the effect of the Miller capacitance. After the functional circuit is in a substantially powered state, the voltage difference between the functional circuit and the power supply conductor is low and so an in-rush current no longer arises. At this point, the additional switching transistor having a greater drive strength can be activated to hold the power gating transistors in the power on state.

The resistive element may comprise at least one of metal and polysilicon. For example, the resistive element may comprise, or be provided within, the polysilicon wires which apply the gate drive voltage to the gate terminal of the power gating transistors. The resistance of such wires can be varied by varying the amount of metal strapping provided on the polysilicon wires. If the resistance of such wires is insufficient to provide an appreciable feedback effect, then the strapping can be omitted or can be reduced in extent, for example by providing strapping at less regular intervals.

In one embodiment, the integrated circuit may comprise a chain of power gating transistors having their gate terminals coupled together. Resistive elements may be provided between the gate terminals of each successive pair of neighbouring power gating transistors. A switching device may apply the gate drive voltage to the gate terminal of a power gating transistor at the start of the chain and the gate drive voltage may be propagated to the gate terminals of the other power gating transistors in the chain via the resistive elements. This arrangement achieves an improved reduction in in-rush current, for at least two reasons.

Firstly, for each power gating transistor in the chain, the effective resistance coupling the transistor to the switching device corresponds to the combination of the resistances of the resistive elements occurring previously in the chain, and so the effective resistance will increase with each successive power gating transistor. This means that, for later transistors in the chain, the magnitude of the drive current will be less than for earlier transistors in the chain. Accordingly, the current required to to charge or discharge the Miller capacitance will be a greater proportion of the total drive current for the later transistors than for the earlier transistors, thus increasing the feedback effect of the Miller capacitance with each successive transistor in the chain.

Also, at each power gating transistor, the feedback effect of the Miller capacitance reduces the slew rate of the gate drive voltage. If the gate terminals of successive power gating transistors are coupled together, then the feedback effect of each transistor will provide a further reduction in slew rate in addition to the reduction caused by preceding transistors in the chain. Hence, the reduction in gate drive voltage slew rate accumulates with each additional transistor in the chain, so that the reduction in slew rate is greater for later transistors than earlier transistors. This means that a transition of the gate drive voltage will occur slightly later for each successive transistor, thus staggering the timing with which each transistor is switched on. Therefore, fewer transistors are switched on at the same time, and so the peak in-rush current is reduced.

Hence, by chaining the gates of the power gating transistors in this way, a greater reduction in in-rush current is achieved. The greater the number of power gating transistors that are chained together, the greater the reduction in in-rush current.

In an embodiment, the resistive element may be formed continuously with the gate terminal of the at least one power gating transistor. This can provide a compact and area-efficient layout for the integrated circuit.

For example, in the previously described embodiment in which the gate terminals of neighbouring power gating transistors are chained together, an efficient layout can be provided in which a continuous element forms the gate terminals of the power gating transistors and the resistive elements between the gate terminals of neighbouring transistors.

To further reduce the in-rush current, the design of the transistor may be configured to provide a large Miller capacitance. In one embodiment, the gate terminal may be provided in a first layer of the power gating transistor and the drain terminal may be provided in a second layer of the power gating transistor, with the drain terminal arranged to overhang the gate terminal so as to increase the Miller capacitance of the transistor.

Viewed from another aspect, the present invention provides a method of powering up a functional circuit using a power supply conductor, at least one power gating transistor and a switching device, said at least one power gating transistor having a source terminal coupled to said power supply conductor, a drain terminal coupled to said functional circuit, and a gate terminal, said at least one power gating transistor having a saturation current and being configured to provide a Miller capacitance between said drain terminal and said gate terminal, said switching device being coupled to said gate terminal via a resistive element and configured to apply a gate drive voltage to said gate terminal via said resistive element, an amount of current passed by said at least one power gating transistor being dependent on said gate drive voltage; said method comprising:

using said switching device to switch said gate drive voltage to allow more current to pass through said at least one power gating transistor; and providing, using said Miller capacitance of said at least one power gating transistor, a feedback mechanism which competes against said switching device to reduce a slew rate of said gate drive voltage such that said current passing between said power supply conductor and said functional circuit through said at least one power gating transistor is less than said saturation current of said at least one power gating transistor.

Viewed from yet another aspect, the present invention provides a method of producing an integrated circuit comprising a functional circuit, a power supply conductor for said functional circuit, at least one power gating transistor and a switching device, said at least one power gating transistor having a source terminal coupled to said power supply conductor, a drain terminal coupled to said functional circuit, and a gate terminal, said at least one power gating transistor having a saturation current and being configured to provide a Miller capacitance between said drain terminal and said gate terminal, said switching device being coupled to said gate terminal via a resistive element and configured to apply a gate drive voltage to said gate terminal via said resistive element, an amount of current passed by said at least one power gating transistor being dependent on said gate drive voltage; said method comprising steps of:

selecting values for a Miller capacitance between said drain terminal and said gate terminal of said power gating transistor, a resistance of said resistive element, and a drive strength of said switching device such that, during operation of said integrated circuit in response to said switching device switching said gate drive voltage to allow more current to pass through said at least one power gating transistor, said Miller capacitance provides a feedback mechanism competing against said switching device to reduce a slew rate of said gate drive voltage such that said current passing between said power supply conductor and said functional circuit through said at least one power gating transistor is less than said saturation current of said at least one power gating transistor;

forming an integrated circuit design based on said selected values; and manufacturing said integrated circuit according to said integrated circuit design.

The above, and other objects, features and advantages of this invention will be apparent from the following detailed description of illustrative embodiments which is to be read in connection with the accompanying drawings.

DESCRIPTION OF NON-LIMITING EXAMPLE EMBODIMENTS

Figure 1:
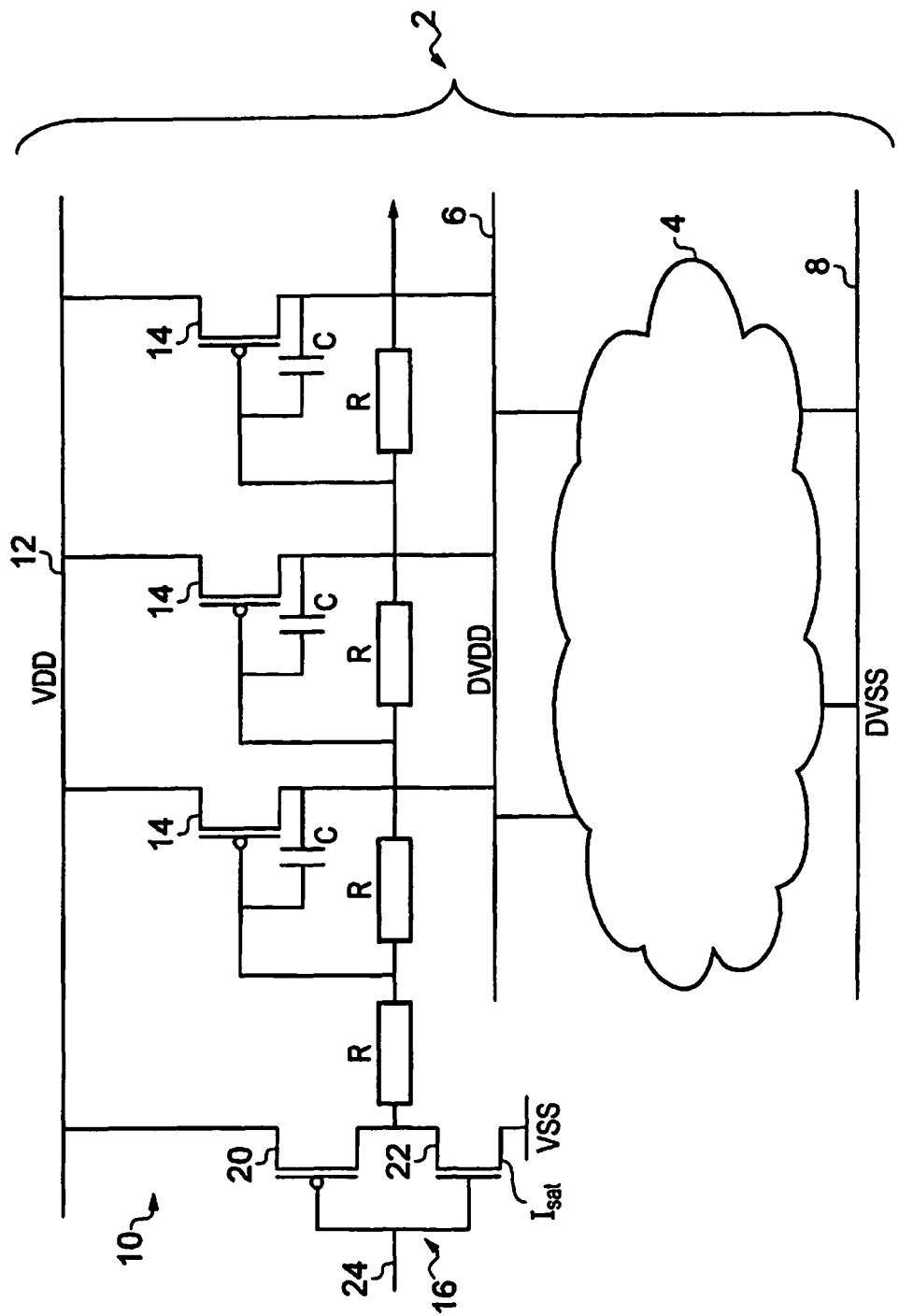
FIG. 1 illustrates an example embodiment of a header power gating circuit for a functional circuit.

FIG. 1 schematically illustrates an integrated circuit 2 comprising a functional circuit 4 coupled between virtual supply rail 6 and virtual ground rail 8. The functional circuit 4 may comprise any kind of semiconductor circuit, for example a memory or processing circuit. Virtual supply rail 6 is coupled to a power supply rail 12 via header circuit 10. The virtual ground rail 8 may similarly be connected to a power supply via footer device which will be discussed later with respect to FIG. 2.

The header circuit 10 comprises a number of p-type power gating transistors 14 and a switching device 16. Under control of the switching device 16, the power gating transistors 14 selectively couple the virtual supply rail 6 of the functional circuit 4 to the power supply rail 12.

Switching device 16 comprises a pullup transistor 20 and a pulldown transistor 22. Pullup transistor 20 has a greater drive strength than pulldown transistor 22. To power down the functional circuit 4, a switching signal 24 supplied to the switching device 16 is switched low to turn on the pullup transistor 20 and switch off the pulldown transistor 22. Hence, the gates of the p-type power gating transistors 14 are driven high, turning off the power gating transistors 14 and cutting off the virtual power supply rail 6 from the power supply rail 12.

When the functional circuit 4 is to be powered up again, then the switching signal 24 is driven high, to turn on the pulldown transistor 22 and turn off the pullup transistor 20. This drives the gate of the power gating transistors 14 low, turning the power gating transistors 14 on so as to allow current to pass from the power supply rail 12 to the functional circuit 4 via the virtual supply rail 6.

The power gating transistors 14 have a Miller capacitance C between their drain and gate terminals, which provides a feedback mechanism which slows the rate at which the gate terminal is switched to a low level by the pulldown transistor 22 of the switching device 16. While the functional circuit 4 is in the powered down state, the pullup transistor 20 is on and so the gate of the power gating transistor 14 is held high. This charges the Miller capacitance C of the power gating transistors 14.

When the pulldown transistor 22 is turned on, then the gate of the power gating transistors 14 is brought to a low level. The pulldown transistor 22 has a relatively weak drive strength, and so the drive current is limited to the saturation current of the pulldown transistor 22. Moreover, some of the drive current is used to discharge the Miller capacitance C and so the amount of current available to discharge the gate drive voltage of the power gating transistors 14 is reduced. Therefore, the power gating transistors 14 turn on relatively slowly, and so the peak in-rush current passing through the power gating transistors 14 is limited to less than the saturation current of the power gating transistors 14.

As explained above, the feedback effect of the Miller capacitance is dependent on a number of factors including the Miller capacitance C of the power gating transistors 14, the drive strength (saturation current $I_{sat}$) of the pulldown transistor 22 and the resistance R of the resistive element coupling the switching device 16 to the gate of the power gating transistors 14. The feedback effect will increase as the resistance R and Miller capacitance C increase and the drive strength of the pulldown transistor 22 decreases. Hence, by selecting a pulldown transistor 22 with a low drive strength, a resistive element having a high resistance, and a power gating transistor 14 with a high Miller capacitance, the feedback effect can be amplified and the in-rush current reduced.

The effect of the feedback mechanism will also scale with the size of the functional circuit being powered. The coupling effect of the Miller capacitance scales with the variation in the voltage difference between the gate and drain terminals of the power gating transistors 14.

For a small functional circuit, the capacitance of the circuit is relatively low, and so when the power gating transistors 14 are turned on, the internal voltage within the functional circuit ramps up relatively quickly. Without the effect of the Miller capacitance, there would be a large peak in-rush current. However, since the gate-drain voltage difference at the power gating transistors 14 varies rapidly as the functional circuit is charged, then the coupling effect of the Miller capacitance is high. The Miller capacitance therefore counteracts the charging of the functional circuit to a significant extent, and so the in-rush current is limited to an acceptable level.

Conversely, for a large functional circuit, the capacitance is relatively high, which means that when the power gating transistors 14 are switched on the internal voltage at the functional circuit changes relatively slowly. Hence, the variation in gate-drain voltage difference at the power gating transistors 14 is smaller than for the small functional circuit. For the larger functional circuit, the feedback effect of the Miller capacitance does not limit the in-rush current to as great an extent as for the small functional circuit. This means that the in-rush current is larger for the large functional circuit than the small functional circuit. This is appropriate since larger functional circuits 4 are typically better connected to the power grid of the integrated circuit and so can handle higher in-rush currents than smaller functional circuits 4. Typically, the amount of in-rush current drawn by the functional circuit 4 scales linearly with the size of the functional circuit 4.

Hence, the feedback effect of the Miller capacitance can limit the in-rush current to an acceptable level for both large and small functional circuits.

As shown in FIG. 1, the header device 10 comprises a chain of power gating transistors 14 having their gate terminals coupled together. The switching device 16 is coupled to the start of the chain and resistive elements R are provided between the gates of successive power gating transistors 14. This arrangement helps to amplify the feedback effect of the Miller capacitance. For each successive transistor 14, the effective resistance between the gate of the transistor 14 and the switching device 16 corresponds to a combination of the resistances of all the resistive elements occurring previously in the chain. Hence, each successive transistor 14 will have a greater effective resistance, and therefore will experience a greater reduction in in-rush current than the preceding transistors 14 in the chain. Also, the gate drive voltage at the gate of each power gating transistor 14 will transition more slowly than the gate drive voltage for the preceding power gating transistor 14, and so this further reduces the in-rush current.

Figure 2:
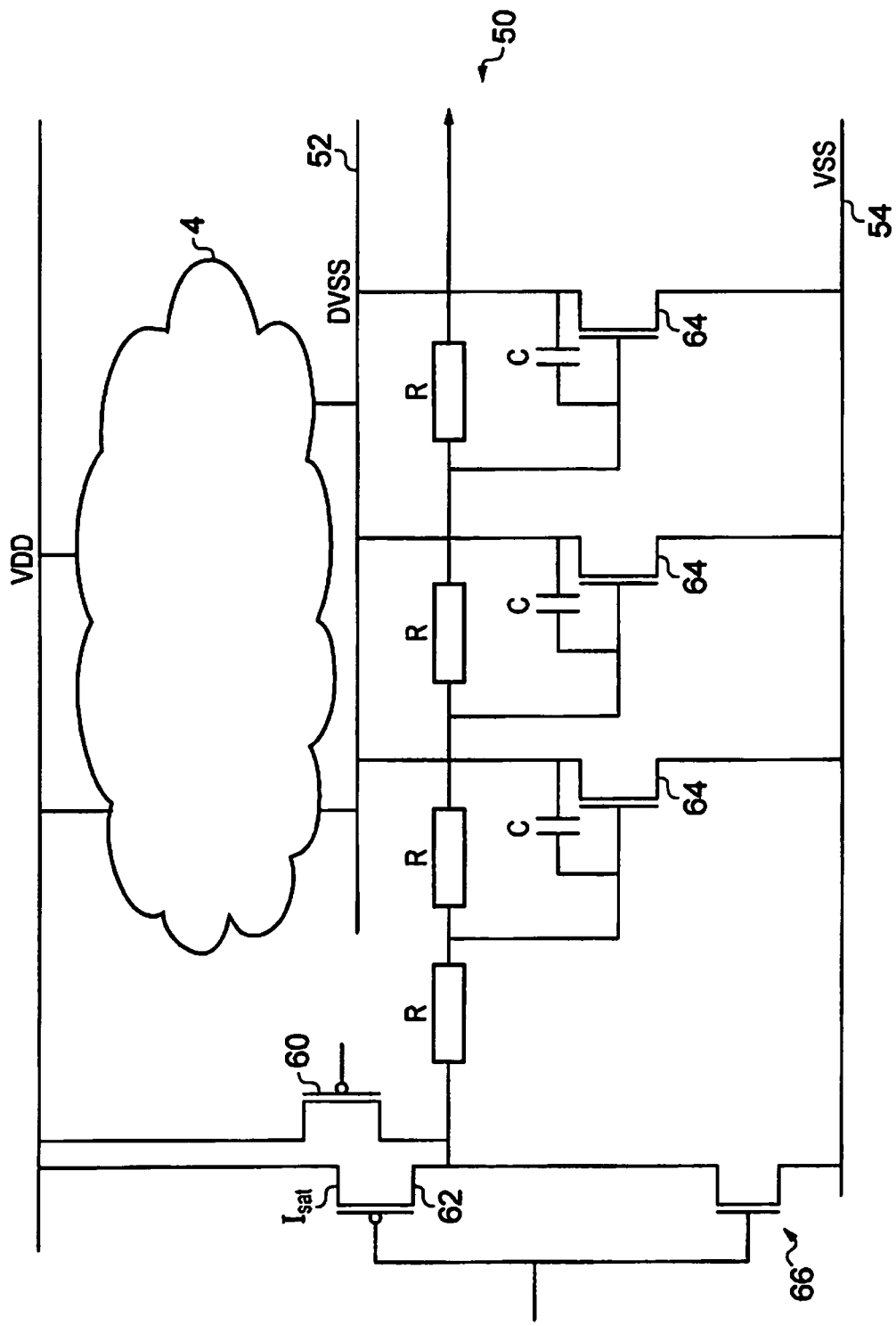
FIG. 2 illustrates an example embodiment of a footer power gating circuit for a functional circuit.

FIG. 2 shows a similar arrangement of power gating transistors in a footer device 50 which couples a virtual ground rail 52 to a ground power supply 54. In this case, the power gating transistors 64 are n-type transistors. When the functional circuit 4 is powered down, then the gate of the power gating transistors 64 is held low, and so the Miller capacitance C between the gate and drain terminals of the power gating transistors 64 is discharged. On power up, the gate drive voltage is driven high. Some of the gate drive current charges the Miller capacitance C, and so less current is available for charging the gate terminals themselves. Hence, the Miller capacitance slows the slew rate of the gate drive voltage, thus reducing the in-rush current through the power gating transistors 64. Again, coupling the power gating transistors 64 in a chain further increases the extent to which the in-rush current is reduced, although this is not essential.

It will be appreciated that in practice an integrated circuit would typically comprise both the header circuit 10 as shown in FIG. 1 and the footer circuit 50 as shown in FIG. 2.

The footer circuit 50 of FIG. 2 comprises an additional transistor 60 coupled in parallel with the pullup transistor 62 of the switching device 66. The additional transistor 60 is controlled by a signal separate from the switching signal provided to the switching device 66. The pullup transistor 62 of the switching device 66 has a low drive strength so as to limit the drive current when powering up the functional circuit and increase the effect of the feedback mechanism provided by the Miller capacitance. The additional transistor 60 can be used to supplement this drive strength once the functional circuit has been powered up. The header circuit 10 of FIG. 1 may similarly comprise an additional transistor in parallel with the pulldown transistor 22 of the switching device 16 to boost the drive strength of the switching device 16 after the circuit 4 has been powered up.

Figure 3A:
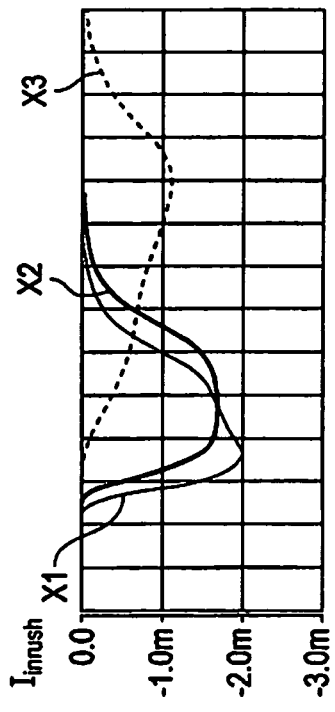
FIG. 3 illustrates simulation results showing a reduction in in-rush current according to the present technique.
Figure 3A:
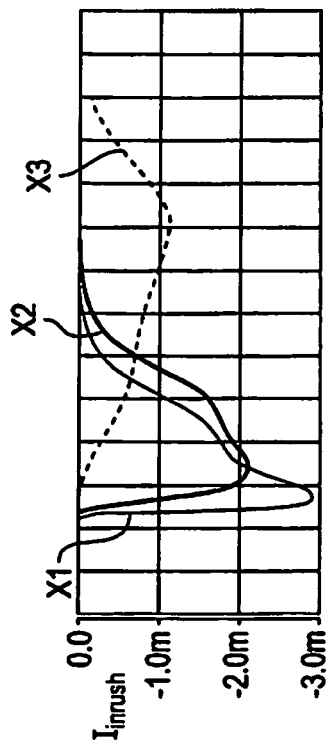
Figure 3B:
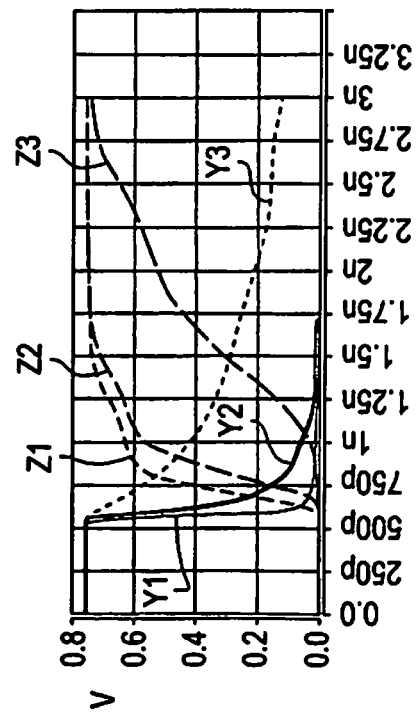

FIG. 3 shows simulation results for the circuit of FIG. 1. The plots in part A of FIG. 3 show a simulation of the circuit of FIG. 1 having the following parameters:

width of power gating transistors 14: 10 µm;
width of pullup transistor 20: 1 µm;
width of pulldown transistor 22: 0.5 µm;
capacitance of functional circuit 4: 1 pF;

The width of the pulldown transistor 22 is relatively small (normally a 2 µm transistor would be used to drive a 10 µm transistor), so the saturation current of the pulldown transistor 22 is relatively low.

Lines X1, X2, X3 represent the in-rush current passing between the power supply rail 12 and the functional circuit. Lines Y1, Y2, Y3 represent the magnitude of the gate drive voltage applied to the gate terminal of the power gating transistor 14. Lines Z1, Z2, Z3 represent the voltage applied to the functional circuit 4.

Lines X1, Y1, Z1 show the case where the effect of the Miller capacitance is suppressed because the RC product of the resistance of the resistive element and the Miller capacitance of the power gating transistor 14 is small (in this example, by providing a negligible resistance R). As shown in part A, there is a relatively large peak in the in-rush current (line X1), because the gate drive voltage transitions rapidly to the low value (line Y1). The functional circuit 4 is powered up quickly (line Z1).

Lines X2, Y2, Z2 show an example in which the RC product is increased (in this case, by providing a resistance R of 10 kΩ). In this case, the gate drive voltage of the power gating transistor 14 transitions more slowly (line Y2). This means that the power gating transistor 14 turns on more slowly and so the current passing through the power gating transistor 14 is less than the saturation current of the transistor 14. Therefore, the peak in-rush current is reduced (line X2), and so more time is required to charge the functional circuit 4. Hence, the functional circuit 4 is powered up more slowly (line Z2).

Lines X3, Y3, Z3 show another example in which the RC product is further increased (in this example, by setting the resistance R to 50 kΩ). In this case, the gate drive voltage slew rate is further reduced (line Y3), and the peak in-rush current is also reduced to a third of that in the first example (line X3 in comparison to line X1). Hence, by boosting the resistance R of the resistive element coupling the switching circuitry 16 to the gate of the power gating transistor 14, the magnitude of the in-rush current can be reduced. Similarly; if the Miller capacitance C of the power gating transistor 14 was increased, then the in-rush current would further be reduced.

Part B of FIG. 3 shows further simulation results for the circuit of FIG. 1. The width of power gating transistors 14 and the pullup transistor 20, and the capacitance of the functional circuit 4, are the same as for part A of FIG. 3. Also, lines X1, Y1, Z1; X2, Y2, Z2; and X3, Y3, Z3 correspond to the same values of the RC product as in part A. However, in part B the width of the pulldown transistor 22 is reduced to 0.15 μm (i.e. drive strength of the pulldown transistor 22 reduced in comparison with part A).

As shown in part B in comparison to part A, reducing the drive strength of the pulldown transistor 22 further reduces the peak in-rush current. This is because the pull down transistor 22 reaches its saturation current earlier and cannot pull the gate terminal of the transistor 14 to the ground level as quickly, as shown in lines Y1, Y2 and Y3 of part B of FIG. 3.

Figure 4:
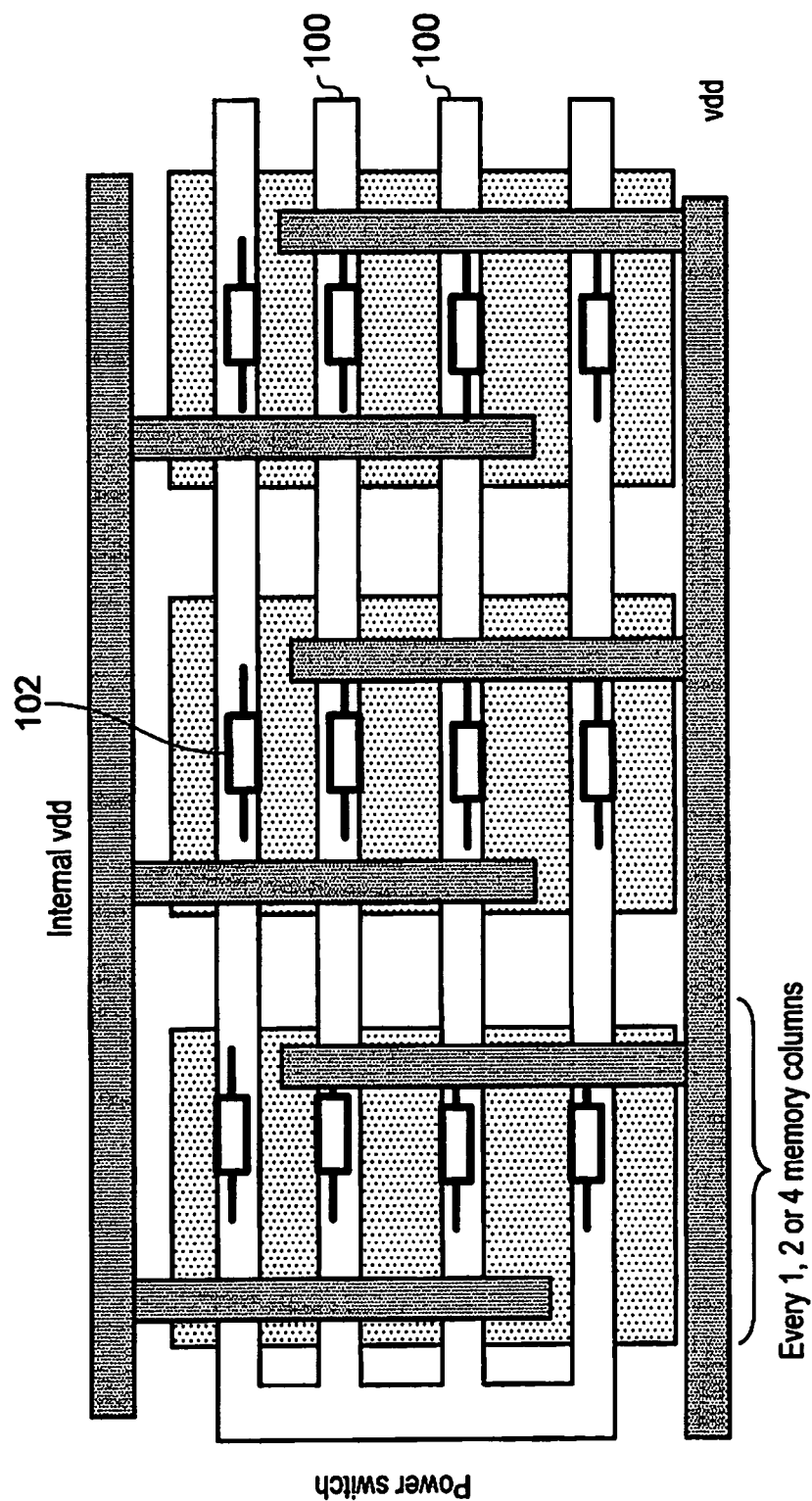
FIG. 4 illustrates an example layout of a power gating circuit.

FIG. 4 shows an example layout of the header circuit. The gate terminals of neighbouring power gating transistors can be formed continuously with one another from polysilicon lines 100. The polysilicon lines 100 may also provide the resistive elements 102 connecting the gate terminals to one another. Metal strapping may be provided on the polysilicon lines 100 to vary the resistance of the lines. The smaller the amount of metal strapping provided, the greater the resistance R of the lines. Hence, the amount of metal can be varied in order to provide a desired resistance R. The layout is dense, simple and scalable. The resistance is provided by the polysilicon forming the gates of the transistors. The capacitance arises between the drain and gate terminals of the transistors.

Figure 5:
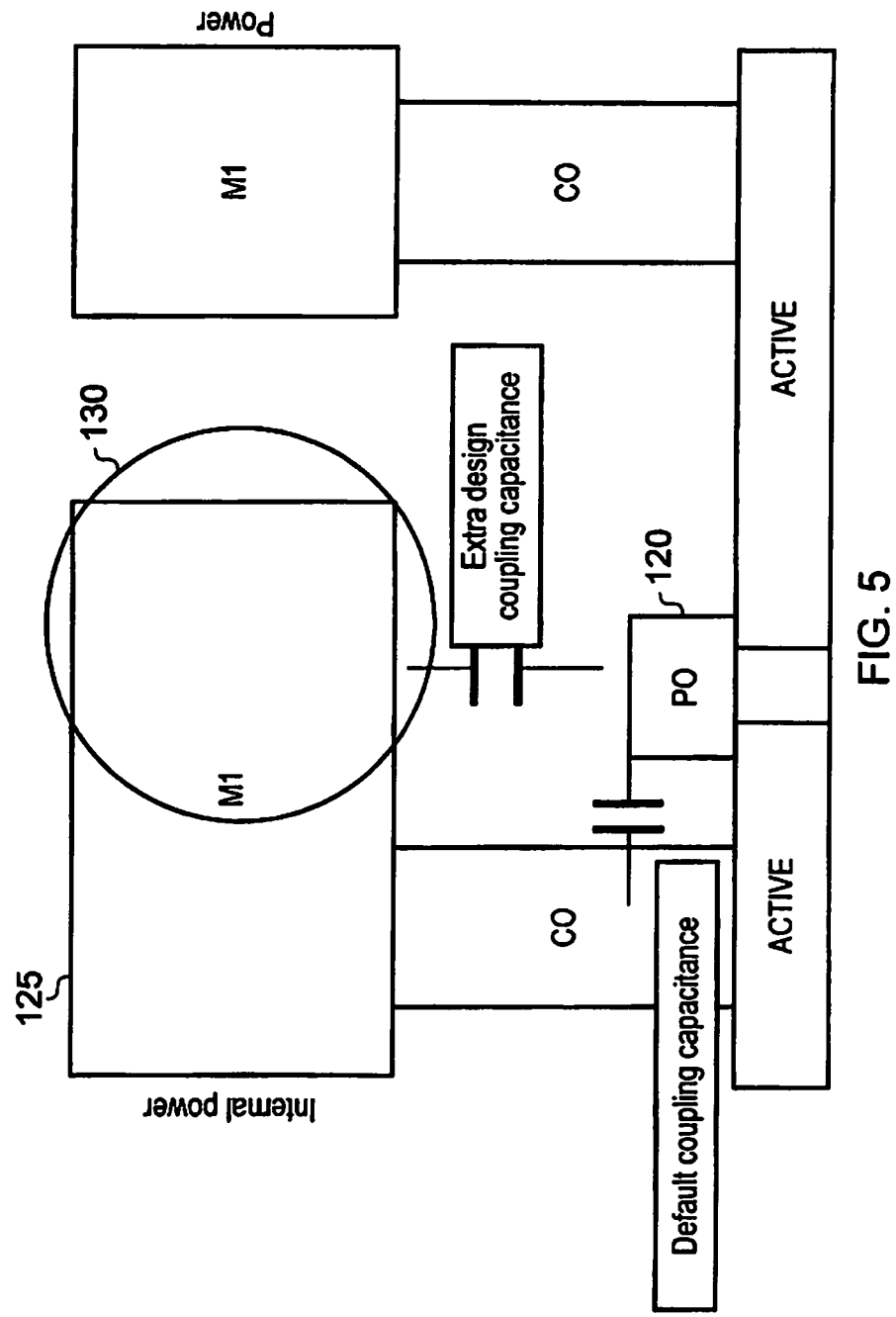
FIG. 5 illustrates a cross section view through a power gating transistor having an increased Miller capacitance.

If the Miller capacitance of the power gating transistors 14 is insufficient for the feedback effect become visible, then the capacitance can be boosted by extending the drain terminal to overhang the gate terminal as illustrated in FIG. 5. In this example, the gate terminal 120 is provided in a first layer of the transistor and the drain terminal 125 is provided in a second layer. The drain terminal 125 may comprise a protruding portion 130 above the gate terminal 120 to provide extra coupling capacitance.

Figure 6:
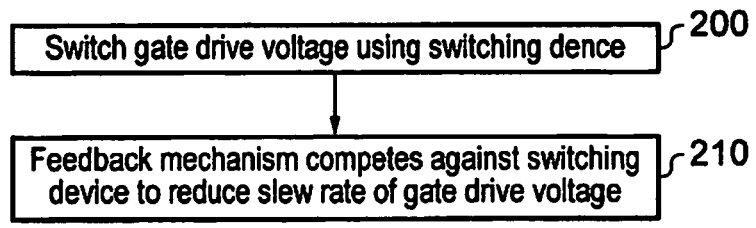
FIG. 6 illustrates a method of powering up a functional circuit.

FIG. 6 illustrates a method of powering up the functional circuit 4. At step 200, the gate drive voltage of the power gating transistors 14, 64 is switched. In the case of the header circuit 10 of FIG. 1, the gate drive voltage is driven low, while for the footer circuit 50 of FIG. 2, the gate drive voltage is driven high. At step 210, the feedback mechanism provided by the Miller capacitance competes against the switching device to reduce the slew rate of the gate drive voltage. This reduces the rate at which the power gating transistors 14, 64 are turned on, and hence reduces the amount of in-rush current flowing through the power gating transistors 14, 64.

Figure 7:
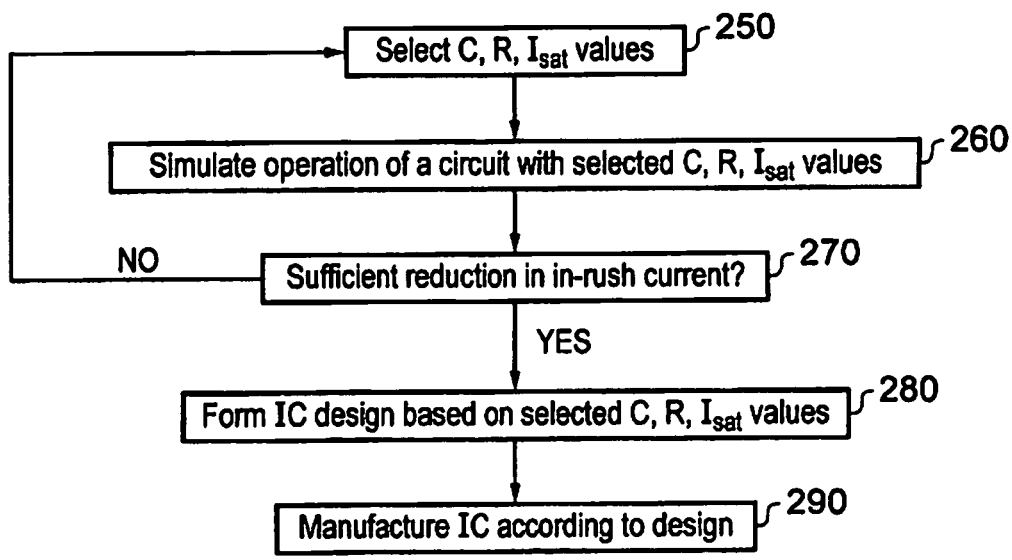
FIG. 7 illustrates a method of producing an integrated circuit.

FIG. 7 illustrates a method of designing and producing an integrated circuit having a power gating circuit according to the present technique. At step 250, values of the Miller capacitance C of the power gating transistors 14, the resistance R of the resistive element, and the saturation current $I_{sat}$ of the switch-on transistor 22, 62 of the switching device 16, 66 are selected. At step 260, the operation of a circuit having the selected C, R and $I_{sat}$ values is simulated. At step 270, the simulation results are analysed to determine whether a sufficient reduction in in-rush current has been achieved. If the reduction in in-rush current is insufficient, then the method returns to step 250 where different C, R and $I_{sat}$ values are selected. If a sufficient reduction in in-rush current is achieved in the simulation results, then at step 280 an integrated circuit design is formed based on the selected C, R and $I_{sat}$ values. The design may be for a full integrated circuit or may be a design of a particular element of the circuit, for example a standard cell design for a standard cell library. At step 290, an integrated circuit is manufactured according to the design formed at step 280.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
a functional circuit;
a power supply conductor for said functional circuit;
at least one power gating transistor having a source terminal coupled to said power supply conductor, a drain terminal coupled to said functional circuit, and a gate terminal, said at least one power gating transistor having a saturation current;
a switching device coupled to said gate terminal via a resistive element, said switching device being configured to apply a gate drive voltage to said gate terminal via said resistive element, an amount of current passed by said at least one power gating transistor being dependent on said gate drive voltage; wherein:
said at least one power gating transistor is configured to provide a Miller capacitance between said drain terminal and said gate terminal; and
said Miller capacitance, a resistance of said resistive element, and a drive strength of said switching device are configured such that, in response to said switching device switching said gate drive voltage to allow more current to pass through said at least one power gating transistor, said Miller capacitance provides a feedback mechanism competing against said switching device to reduce a slew rate of said gate drive voltage such that said current passing between said power supply conductor and said functional circuit through said at least one power gating transistor is less than said saturation current of said at least one power gating transistor,
wherein said switching device comprises a first transistor for pulling said gate drive voltage to a power off level and a second transistor for pulling said gate drive voltage to a power on level, said second transistor having a lower drive strength than said first transistor.

2. The integrated circuit according to claim 1, comprising an additional switching transistor having a greater drive strength than said switching device, said additional switching transistor being configured to apply said gate drive voltage to said gate terminal after said functional circuit is in a substantially powered state.

3. The integrated circuit according to claim 1, wherein said resistive element comprises at least one of metal and polysilicon.

4. The integrated circuit according to claim 1, wherein said resistive element is formed continuously with said gate terminal of said at least one power gating transistor.

5. The integrated circuit according to claim 1, wherein said gate terminal is provided in a first layer of said power gating transistor, said drain terminal is provided in a second layer of said power gating transistor, and said drain terminal overhangs said gate terminal.

6. An integrated circuit comprising:
a functional circuit;
a power supply conductor for said functional circuit;
at least one power gating transistor having a source terminal coupled to said power supply conductor, a drain terminal coupled to said functional circuit, and gate terminal, said at least one power gating transistor having a saturation current;
a switching device coupled to said gate terminal via a resistive element, said switching device being configured to apply a gate drive voltage to said gate terminal via said resistive element, an amount of current passed by said at least one power gating transistor being dependent on said gate drive voltage; wherein:
said at least one power gating transistor is configured to provide a Miller capacitance between said drain terminal and said gate terminal; and
said Miller capacitance, a resistance of said resistive element, and a drive strength of said switching device are configured such that, in response to said switching device switching said gate drive voltage to allow more current to pass through said at least one power gating transistor, said Miller capacitance provides a feedback mechanism competing against said switching device to reduce a slew rate of said gate drive voltage such that said current passing between said power supply conductor and said functional circuit through said at least one power gating transistor is less than said saturation current of said at least one power gating transistor,
the integrated circuit further comprising a chain of power gating transistors having their gate terminals coupled together, resistive elements being provided between the gate terminals of each successive pair of neighbouring power gating transistors, said switching device being configured to apply said gate drive voltage to the gate terminal of a power gating transistor at a start of said chain and said gate drive voltage propagating to the gate terminals of the other power gating transistors via said resistive elements.

7. A method of powering up a functional circuit using a power supply conductor, at least one power gating transistor and a switching device, said at least one power gating transistor having a source terminal coupled to said power supply conductor, a drain terminal coupled to said functional circuit, and a gate terminal, said at least one power gating transistor having a saturation current and being configured to provide a Miller capacitance between said drain terminal and said gate terminal, said switching device being coupled to said gate terminal via a resistive element and configured to apply a gate drive voltage to said gate terminal via said resistive element, an amount of current passed by said at least one power gating transistor being dependent on said gate drive voltage; said method comprising:
using said switching device to switch said gate drive voltage to allow more current to pass through said at least one power gating transistor; and
providing, using said Miller capacitance of said at least one power gating transistor, a feedback mechanism which competes against said switching device to reduce a slew rate of said gate drive voltage such that said current passing between said power supply conductor and said functional circuit through said at least one power gating transistor is less than said saturation current of said at least one power gating transistor.

8. A method of producing an integrated circuit comprising a functional circuit, a power supply conductor for said functional circuit, at least one power gating transistor and a switching device, said at least one power gating transistor having a source terminal coupled to said power supply conductor, a drain terminal coupled to said functional circuit, and a gate terminal, said at least one power gating transistor having a saturation current and being configured to provide a Miller capacitance between said drain terminal and said gate terminal, said switching device being coupled to said gate terminal via a resistive element and configured to apply a gate drive voltage to said gate terminal via said resistive element, an amount of current passed by said at least one power gating transistor being dependent on said gate drive voltage;
said method comprising steps of:
selecting values for a Miller capacitance between said drain terminal and said gate terminal of said power gating transistor, a resistance of said resistive element, and a drive strength of said switching device such that, during operation of said integrated circuit in response to said switching device switching said gate drive voltage to allow more current to pass through said at least one power gating transistor, said Miller capacitance provides a feedback mechanism competing against said switching device to reduce a slew rate of said gate drive voltage such that said current passing between said power supply conductor and said functional circuit through said at least one power gating transistor is less than said saturation current of said at least one power gating transistor, wherein said switching device comprises a first transistor for pulling said gate drive voltage to a power off level and a second transistor for pulling said gate drive voltage to a power on level, said second transistor having a lower drive strength than said first transistor;
forming an integrated circuit design based on said selected values; and
manufacturing said integrated circuit according to said integrated circuit design.

* * * * *